(12) United States Patent
Rawat et al.

(10) Patent No.: US 11,984,850 B2
(45) Date of Patent: May 14, 2024

(54) OSCILLATOR WITH ACTIVE INDUCTOR

(71) Applicant: TEXAS INSTRUMENTS INCORPORATED, Dallas, TX (US)

(72) Inventors: Udit Rawat, West Lafayette, IN (US); Bichoy Bahr, Allen, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/876,008

(22) Filed: Jul. 28, 2022

(65) Prior Publication Data

US 2024/0039475 A1 Feb. 1, 2024

(51) Int. Cl.
*H03B 5/24* (2006.01)
*G01S 13/88* (2006.01)
*H03H 9/02* (2006.01)

(52) U.S. Cl.
CPC ............... *H03B 5/24* (2013.01); *G01S 13/88* (2013.01); *H03H 9/02007* (2013.01)

(58) Field of Classification Search
CPC ........ H03B 5/24; G01S 13/88; H03H 9/02007
See application file for complete search history.

(56) References Cited

U.S. PATENT DOCUMENTS

| | | | |
|---|---|---|---|
| 9,531,323 B1 * | 12/2016 | Khalili | ................. H03B 5/1212 |
| 2020/0274514 A1 * | 8/2020 | Yen | ........................ H03H 9/175 |

* cited by examiner

*Primary Examiner* — Jeffrey M Shin
(74) *Attorney, Agent, or Firm* — Frank D. Cimino (57) ABSTRACT

An oscillator circuit includes a bulk acoustic wave resonator, a differential active inductor circuit, and a gain circuit. The differential active inductor circuit is configured to bias the bulk acoustic wave resonator. The differential active inductor circuit is coupled between the bulk acoustic wave resonator and a power supply terminal. The gain circuit is coupled to the bulk acoustic wave resonator.

23 Claims, 7 Drawing Sheets

OSCILLATOR WITH ACTIVE INDUCTOR

BACKGROUND

A resonator is a device or system that naturally oscillates at frequencies called resonant frequencies. Resonators can be, for example, crystal resonators (also known as quartz resonators), inductance-capacitance (LC) resonators, or microelectromechanical system (MEMS) resonators. Resonators are generally passive devices that are combined with active circuitry to create an oscillator. The oscillator produces a periodic signal at the resonant frequency. A crystal oscillator, for example, is an electronic circuit that uses the mechanical resonance of a vibrating crystal to create an electrical signal with a very precise frequency. Crystal oscillators may be used to generate frequencies to keep track of time or to generate a clock signal for digital integrated circuits. MEMS resonators may be used in place of crystal resonators to keep track of time and to generate a stable clock signal for analog and digital integrated circuits.

SUMMARY

In one example, an oscillator circuit includes a bulk acoustic wave resonator, a first active inductor circuit, and a second active inductor circuit. The bulk acoustic wave resonator includes a first terminal and a second terminal. The first active inductor circuit is coupled between the first terminal and a power supply terminal. The second active inductor circuit is coupled between the second terminal and the power supply terminal.

In another example, an oscillator circuit includes a bulk acoustic wave resonator, a differential active inductor circuit, and a gain circuit. The differential active inductor circuit is configured to bias the bulk acoustic wave resonator. The differential active inductor circuit is coupled between the bulk acoustic wave resonator and a power supply terminal. The gain circuit is coupled to the bulk acoustic wave resonator.

In a further example, a radar system includes a transmitter and an oscillator circuit. The oscillator circuit is coupled to the transmitter. The oscillator circuit includes a bulk acoustic wave resonator, a differential active inductor circuit, and a gain circuit. The bulk acoustic wave resonator includes a first terminal and a second terminal. The differential active inductor circuit is configured to bias the bulk acoustic wave resonator. The differential active inductor circuit is coupled between the bulk acoustic wave resonator and a power supply terminal. The differential active inductor circuit includes a first transistor, a first resistor, a second transistor, and a second resistor. The first transistor has a source, a drain, and a gate. The source is coupled to the power supply terminal. The drain is coupled to the first terminal. The first resistor is coupled between the drain and the gate. The second transistor has a source, a drain, and a gate. The source of the second transistor is coupled to the power supply terminal. The drain of the second transistor is coupled to the second terminal. The second resistor is coupled between the drain of the second transistor and the gate of the second transistor. The gain circuit is coupled to the bulk acoustic wave resonator.

DETAILED DESCRIPTION

Bulk acoustic wave (BAW) MEMS resonators are sensitive to capacitive loading, which degrades quality factor and impedance of the resonator. Unlike inductor-capacitor (L-C) oscillators, BAW resonators appear as a capacitive load away from parallel resonance, which makes them susceptible to high gain and spurious oscillation at low frequencies. Accordingly, to implement a low-power oscillator using a BAW resonator, minimization of capacitive loading and elimination of parasitic oscillation at low frequencies is desirable. Some BAW resonator-based oscillators include transformer/inductor loading of the oscillator tank to help alleviate the issues associated with capacitive loading, and to provide DC biasing. Transformers and inductors are relatively large and substantially increase circuit area (e.g., die area).

The oscillator circuits described herein include active inductor circuits. The active inductor circuits are significantly smaller than transformers or inductors, allowing for a reduction in circuit size and cost. The active inductor circuits provide biasing, reduce capacitive loading, and reduce spurious oscillations at low frequencies.

Figure 1:
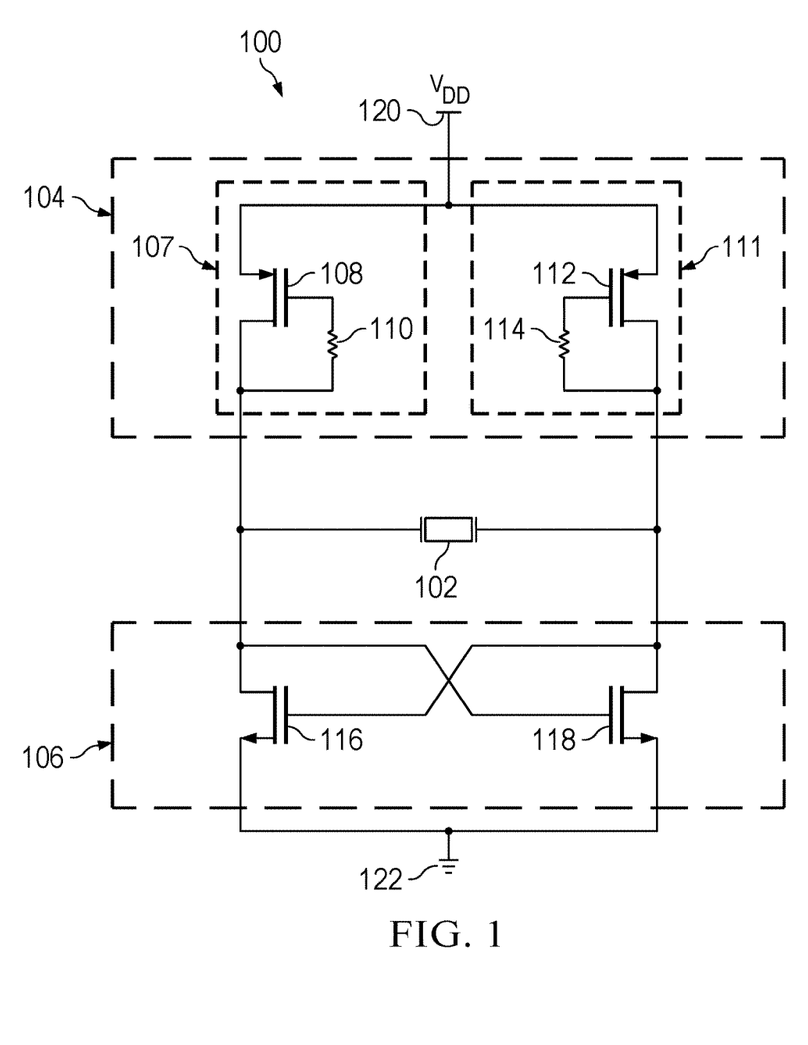
FIG. 1 is a schematic level diagram of an example oscillator circuit that includes active inductor circuitry.

FIG. 1 is a schematic level diagram of an example oscillator circuit 100 that includes active inductor circuitry. The oscillator circuit 100 includes a BAW resonator 102, a differential active inductor circuit 104, and a gain circuit 106. The BAW resonator 102 may have a resonant frequency in a range of 1-10 gigahertz or higher in some implementations. The BAW resonator 102 is coupled to the differential active inductor circuit 104 and the gain circuit 106. The differential active inductor circuit 104 includes an active inductor circuit 107, and an active inductor circuit 111. The active inductor circuit 107 is coupled between a first terminal of the BAW resonator 102 and a power supply terminal 120. The active inductor circuit 111 is coupled between a second terminal of the BAW resonator 102 and the power supply terminal 120.

The active inductor circuit 107 includes a transistor 108 and a resistor 110. The transistor 108 may be a p-channel field effect transistor (PFET). A source of the transistor 108 is coupled to the power supply terminal 120. A drain of the transistor 108 is coupled to the first terminal of the BAW resonator 102. The resistor 110 is coupled between the gate of the transistor 108 and the drain of the transistor 108.

The active inductor circuit 111 includes a transistor 112 and a resistor 114. The transistor 112 may be a PFET. A source of the transistor 112 is coupled to the power supply terminal 120. A drain of the transistor 112 is coupled to the second terminal of the BAW resonator 102. The resistor 114 is coupled between the gate of the transistor 112 and the drain of the transistor 112.

Like an inductor, the impedance of the differential active inductor circuit 104 increases with frequency. The impedance of the differential active inductor circuit 104 ($Z_{L_a}$) may be expressed as:

$$Z_{L_a}(\omega) = \frac{2}{g_{m_p}} \frac{1 + \frac{j\omega}{\omega_Z}}{1 + \frac{j\omega}{\omega_p}},$$

$$\omega_Z = \frac{1}{R_{L_a} C_{gsp}}, \text{ and}$$

$$\omega_p = \frac{g_{m_p}}{C_{gsp}}$$

where:
$R_{L_a}$ is the resistance of the resistor 110 and the resistor 114;
$g_{m_p}$ is the transconductance of the transistor 108 and the transistor 112; and
$C_{gsp}$ is the gate-to-source capacitance of the transistor 108 and the transistor 112.

The gain circuit 106 includes a transistor 116 and a transistor 118. The transistor 116 and the transistor 118 may be n-channel FETs (NFETs). Output of the oscillator circuit 100 is provided at the drain of the transistor 116 and the drain of the transistor 118. A source of the transistor 116 is coupled to a ground terminal 122. A drain of the transistor 116 is coupled to the first terminal of the BAW resonator 102. A gate of the transistor 116 is coupled to the second terminal of the BAW resonator 102.

A source of the transistor 118 is coupled to the ground terminal 122. A drain of the transistor 118 is coupled to the second terminal of the BAW resonator 102. A gate of the transistor 118 is coupled to the first terminal of the BAW resonator 102.

Figure 2:
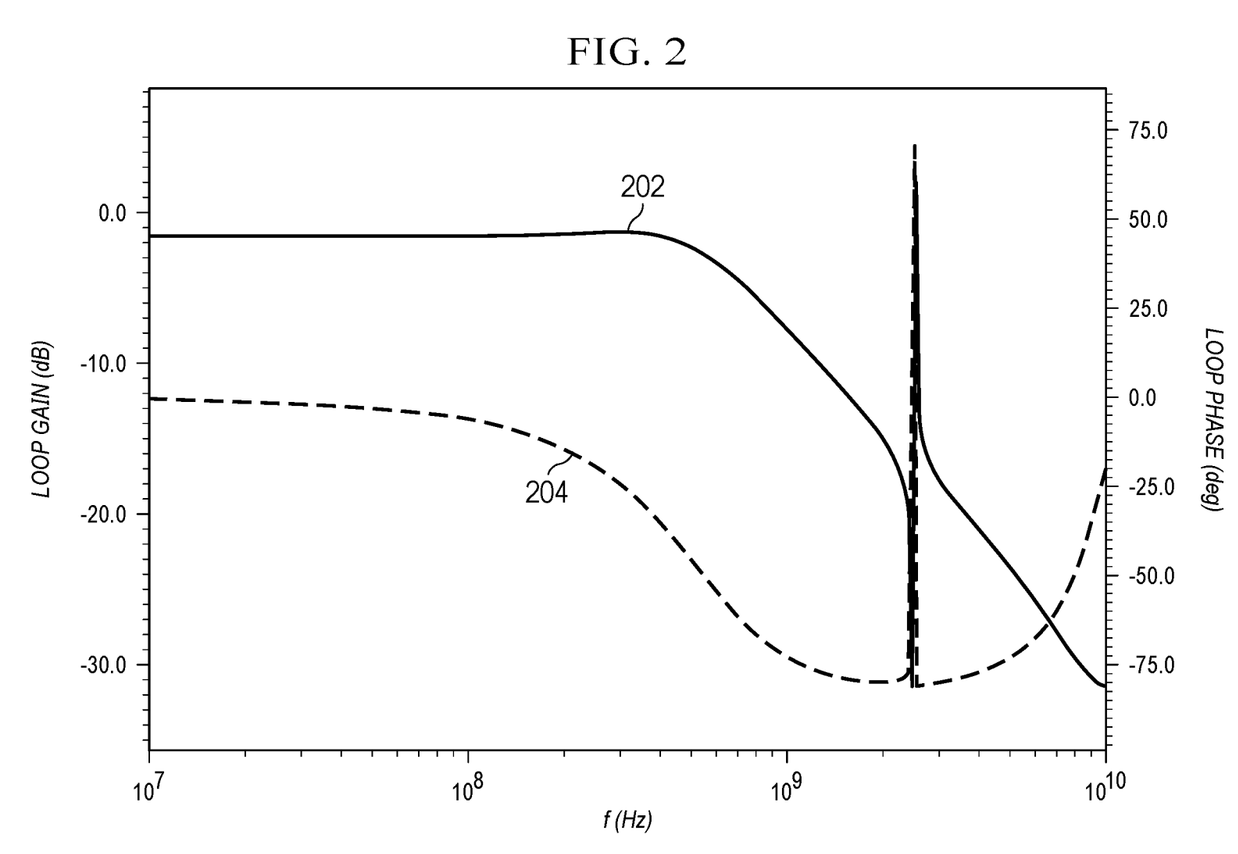
FIG. 2 is a graph of example gain and phase in the oscillator circuit of FIG. 1.

FIG. 2 is a graph of example loop gain and phase in the oscillator circuit 100. The graph of FIG. 2 includes a gain plot 202 and a phase plot 204. The transistor 108 and the transistor 112 are selected such that their gain at DC (at low frequencies) is sufficiently low to avoid oscillation at low frequencies, as shown in the gain plot 202.

Figure 3:
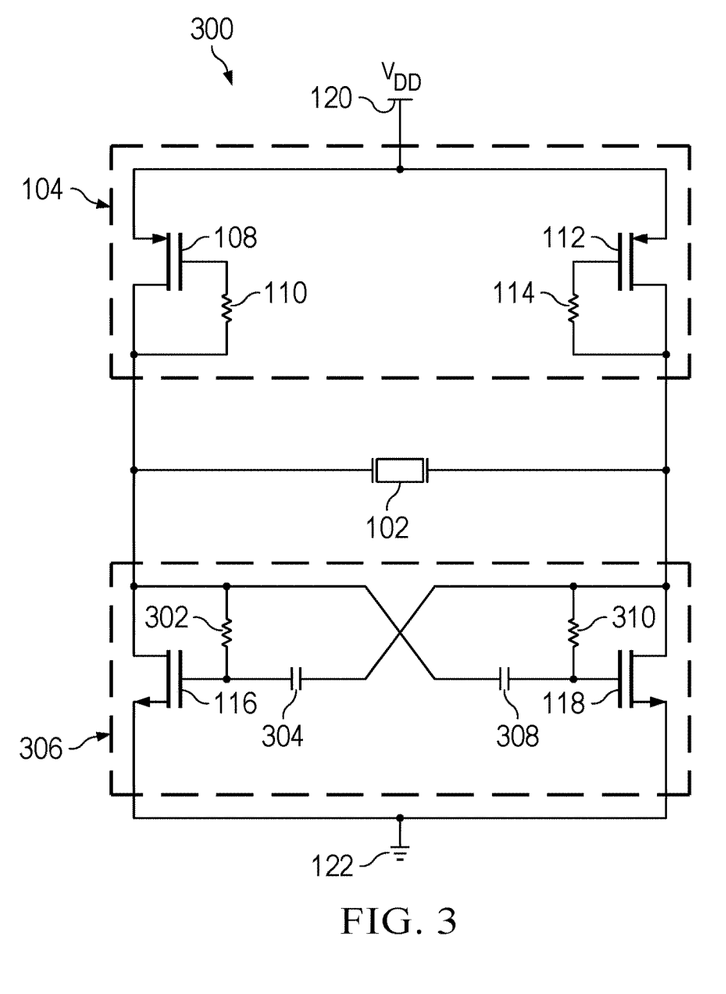
FIG. 3 is a schematic level diagram of a second example oscillator circuit that includes active inductor circuitry.

FIG. 3 is a schematic level diagram of a second example oscillator circuit 300 that includes active inductor circuitry. The oscillator circuit 300 is similar to the oscillator circuit 100, and includes high-pass filtering in the gain circuit to further reduce DC gain and reduce the likelihood of parasitic oscillation. The oscillator circuit 300 includes the BAW resonator 102 and the differential active inductor circuit 104, and further includes a gain circuit 306. The gain circuit 306 includes the transistor 116, the transistor 118, a resistor 302, a capacitor 304, a capacitor 308, and a resistor 310. The resistor 302, the capacitor 304, the capacitor 308, and the resistor 310 high-pass filter the output of the oscillator circuit 300. The resistor 302 is coupled between the gate of the transistor 116 and the drain of the transistor 116. The capacitor 304 is coupled between the gate of the transistor 116 and the drain of the transistor 118. The capacitor 308 is coupled between the gate of the transistor 118 and the drain of the transistor 116. The resistor 310 is coupled between the gate of the transistor 118 and the drain of the transistor 118.

Figure 4:
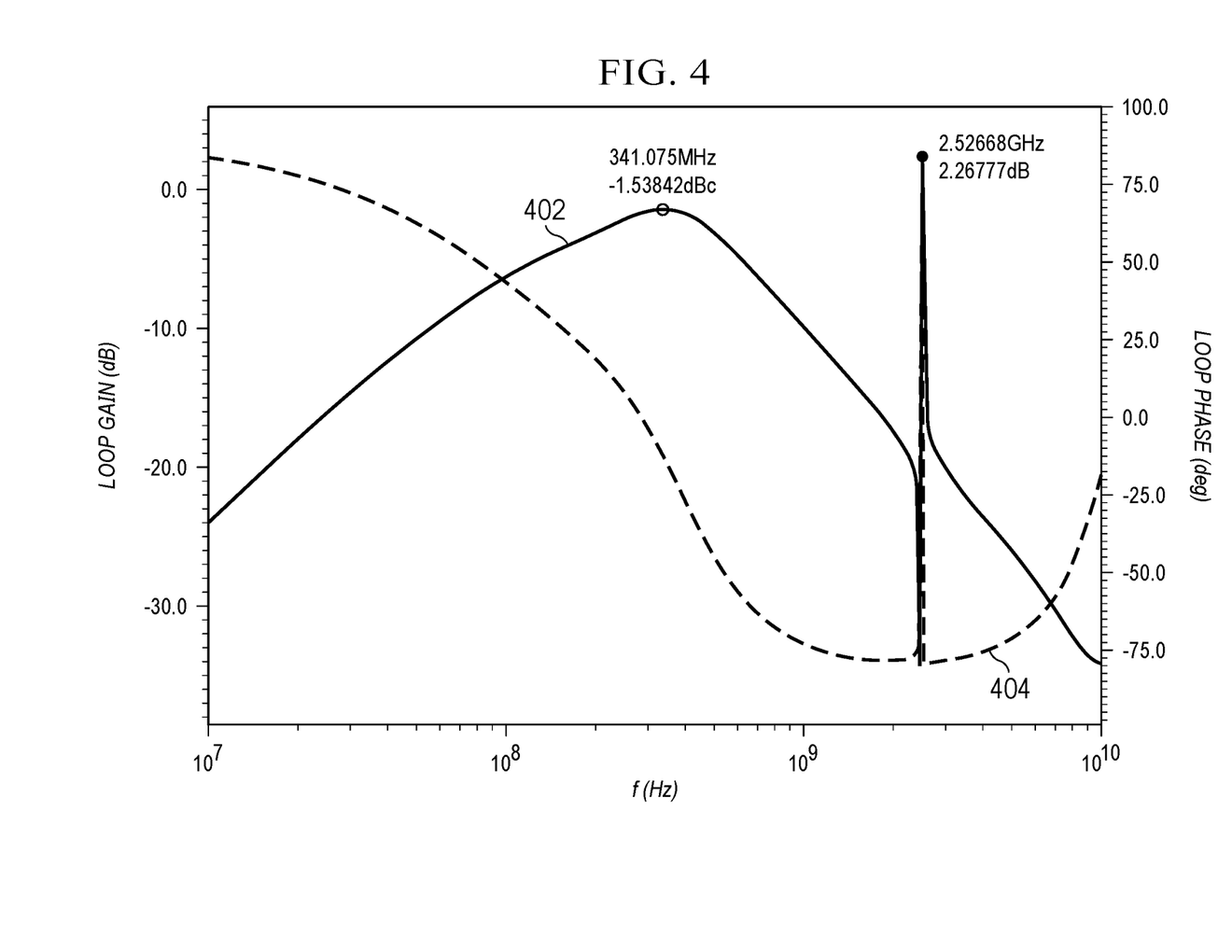
FIG. 4 is a graph of example gain and phase in the oscillator circuit of FIG. 3.

FIG. 4 is a graph of example gain and phase in the oscillator circuit 300. The graph of FIG. 4 includes a gain plot 402 and a phase plot 404. The gain plot 402 shows that the high-pass filtering of the oscillator circuit 300 substantially reduces the low frequency gain of the oscillator circuit 300 relative to the gain of the oscillator circuit 100 as shown in FIG. 2. Accordingly, the oscillator circuit 300 provides improved immunity to parasitic oscillation.

Figure 5:
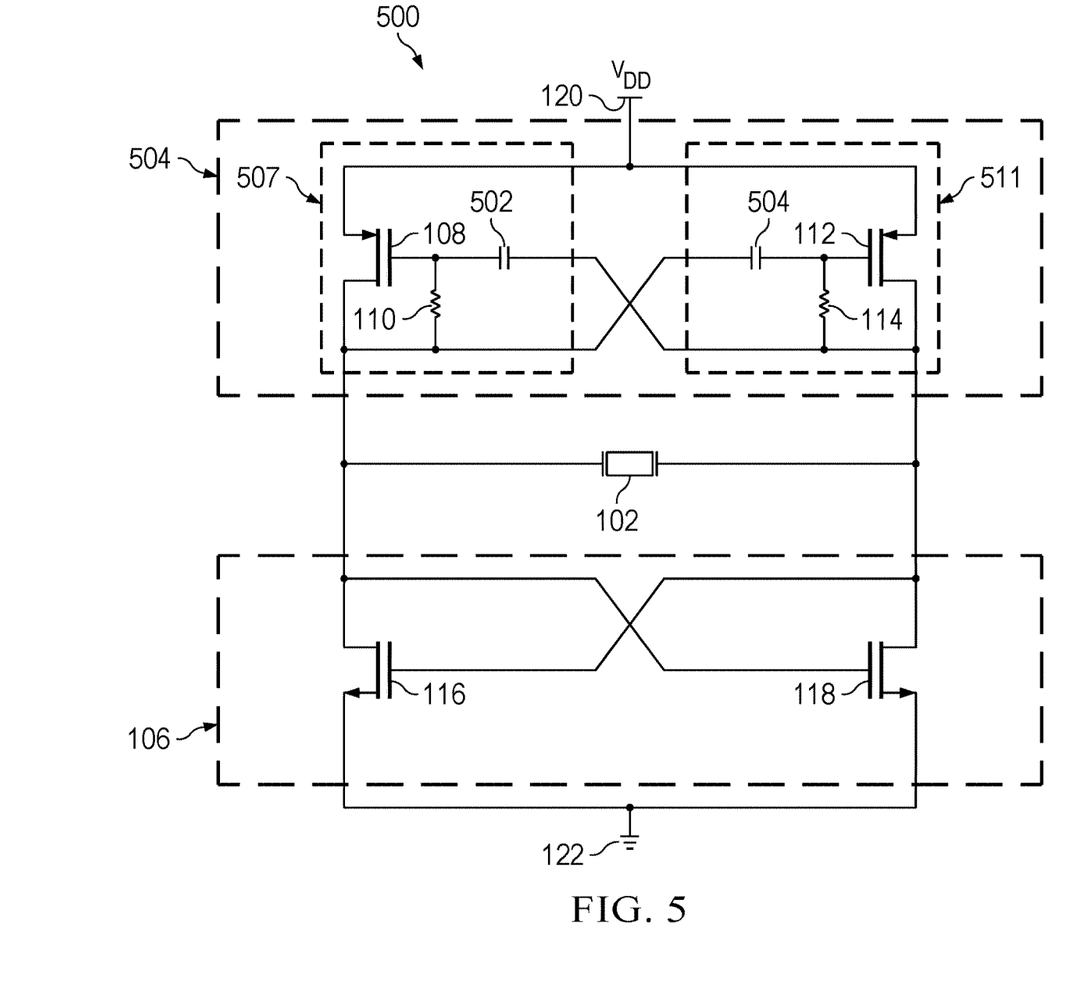
FIG. 5 is a schematic level diagram of a third example oscillator circuit that includes active inductor circuitry.

FIG. 5 is a schematic level diagram of a third example oscillator circuit 500 that includes active inductor circuitry. The oscillator circuit 500 is similar to the oscillator circuit 100. In the oscillator circuit 500, the differential active inductor circuit is configured to provide gain at the resonant frequency of the BAW resonator 102. The added gain further reduces the likelihood of parasitic oscillation. The oscillator circuit 500 includes the BAW resonator 102, the gain circuit 106, and a differential active inductor circuit 504. The differential active inductor circuit 504 includes an active inductor circuit 507, and an active inductor circuit 511. The active inductor circuit 507 is coupled between a first terminal of the BAW resonator 102 and a power supply terminal 120. The active inductor circuit 511 is coupled between a second terminal of the BAW resonator 102 and the power supply terminal 120.

The active inductor circuit 507 includes the transistor 108, the resistor 110, and a capacitor 502. The active inductor circuit 511 includes the transistor 112, the resistor 114, and a capacitor 506. The active inductor circuit 507 and the active inductor circuit 511 are cross-coupled via the capacitor 502 and the capacitor 506. The capacitor 502 is coupled between the gate of the transistor 108 and the drain of the transistor 112. The capacitor 506 is coupled between the gate of the transistor 112 and the drain of the transistor 108. High-pass filtering provided by the capacitor 502 and the capacitor 506 increases the gain of the differential active inductor circuit 504 at the resonant frequency of the BAW resonator 102, which improves the figure of merit of the oscillator circuit 500. The increased gain at resonance reduces the likelihood of parasitic oscillation in the oscillator circuit 500.

Another implementation of the oscillator circuit 500 may include the gain circuit 306 in place of the gain circuit 106 to further reduce the likelihood of parasitic oscillation.

Figure 6:
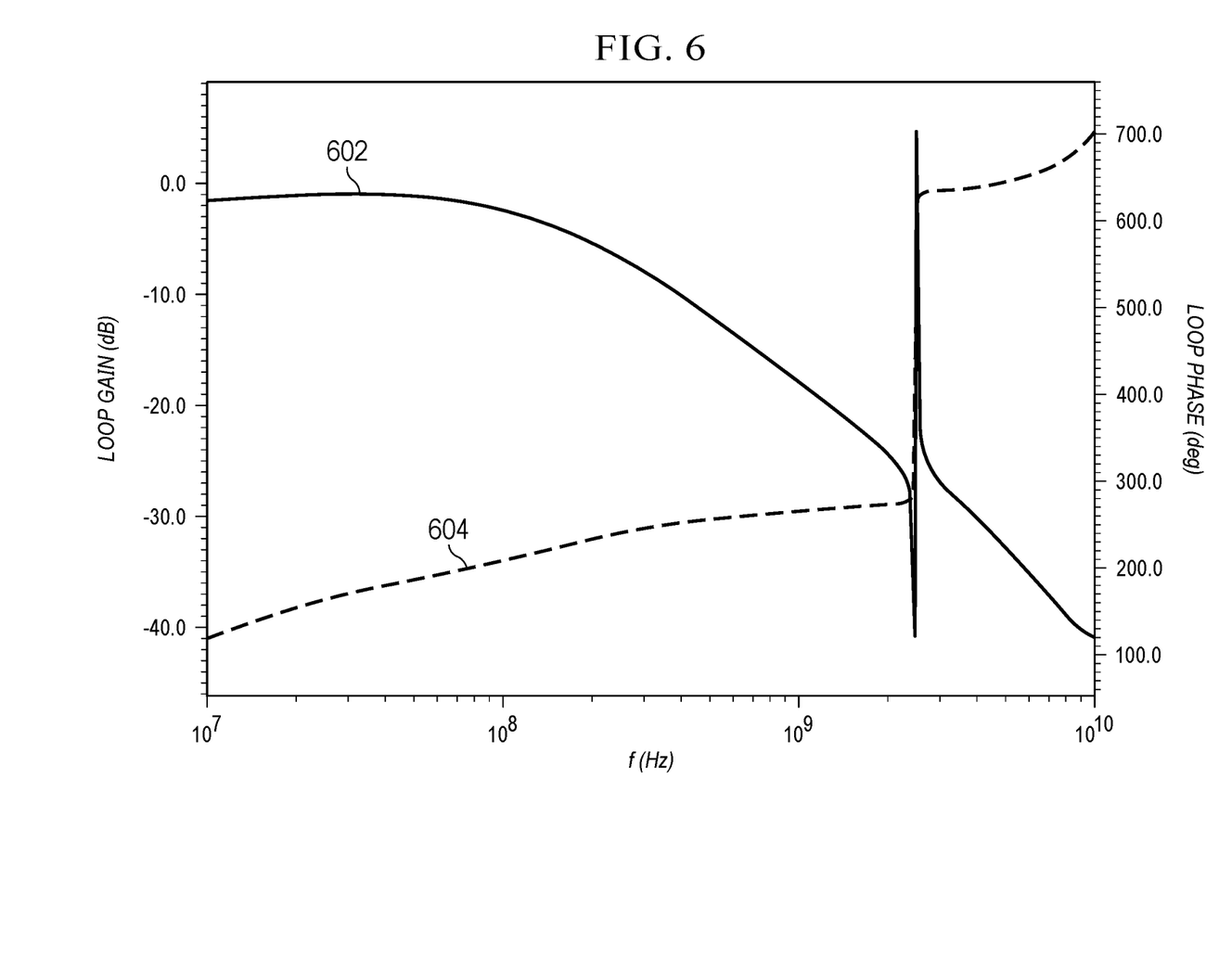
FIG. 6 is a graph of example gain and phase in the oscillator circuit of FIG. 5.

FIG. 6 is a graph of example gain and phase in the oscillator circuit 500. The graph of FIG. 6 includes a gain plot 602 and a phase plot 604. In the gain plot 602, the gain at resonance (about 2.5 gigahertz) is substantially greater (at least 2 dB greater) than the gain at resonance of the oscillator circuit 300 shown in FIG. 4.

The close-in phase noise (e.g., phase noise up 1 kilohertz offset from the resonant frequency of the BAW resonator 102) of the oscillator circuit 500 is lower than that of the oscillator circuit 300. For example, close-in phase noise of the oscillator circuit 500 may be about 2 dB lower than the close-in phase noise of the oscillator circuit 300.

Figure 7:
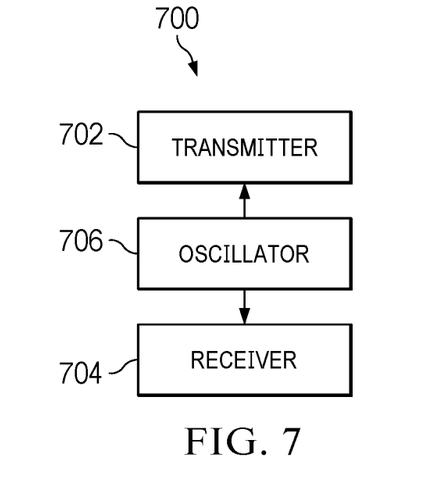
FIG. 7 is block diagram for an example radar system that includes an oscillator having active inductor circuitry.

FIG. 7 is block diagram for an example radar system 700 that includes an oscillator having active inductor circuitry. The radar system 700 includes a transmitter 702, a receiver 704, and an oscillator 706. The transmitter 702 may be coupled to an antenna for transmission of radar signals. The receiver 704 may be coupled to an antenna for reception of radar signals. The oscillator 706 is coupled to the transmitter 702 and/or the receiver 704, and provides an oscillator signal for use by the transmitter 702 and/or the receiver 704. The oscillator 706 includes an implementation of the oscillator circuit 100, the oscillator circuit 300, or the oscillator circuit 500.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor ("FET") (such as an NFET or a PFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. An oscillator circuit, comprising:
   a bulk acoustic wave (BAW) resonator including a first resonator terminal and a second resonator terminal, the BAW resonator having a resonant frequency at or above 1 gigaHertz (GHz);
   a first active inductor circuit coupled between the first resonator terminal and a power supply terminal, the first active inductor circuit configured to bias the BAW resonator and having a first impedance that reduces with a first frequency where the first frequency is at or above 1 GHz; and
   a second active inductor circuit coupled between the second resonator terminal and the power supply terminal, the second active inductor circuit configured to bias the BAW resonator and having a second impedance that reduces with a second frequency where the second frequency is at or above 1 GHz.

2. The oscillator circuit of claim 1, wherein the first active inductor circuit includes:
   a first transistor having:
      a first current terminal coupled to the power supply terminal;
      a second current terminal coupled to the first resonator terminal; and
      a first control terminal; and
   a first resistor coupled between the second current terminal and the first control terminal.

3. The oscillator circuit of claim 2, wherein the second active inductor circuit includes:
   a second transistor including:
      a third current terminal coupled to the power supply terminal;
      a fourth current terminal coupled to the second resonator terminal; and
      a second control terminal; and
   a second resistor coupled between the fourth current terminal and the second control terminal.

4. The oscillator circuit of claim 3, wherein the oscillator circuit includes:
  a first capacitor coupled between the first control terminal and the second resonator terminal; and
  a second capacitor coupled between the second control terminal and the first resonator terminal of the second transistor and the first terminal.

5. The oscillator circuit of claim 1, wherein the oscillator circuit includes:
  a first transistor having:
    a first current terminal coupled to the first resonator terminal;
    a first control terminal coupled to the second resonator terminal; and
    a second current terminal coupled to a ground terminal; and
  a second transistor having:
    a third current terminal coupled to the second resonator terminal;
    a second control terminal coupled to the first resonator terminal; and
    a fourth current terminal coupled to the ground terminal.

6. The oscillator circuit of claim 5, wherein the oscillator circuit includes:
  a first capacitor coupled between the first control terminal and the second resonator terminal; and
  a first resistor coupled between the first control terminal and the first resonator terminal.

7. The oscillator circuit of claim 6, wherein the oscillator circuit includes:
  a second capacitor coupled between the second control terminal and the first resonator terminal; and
  a second resistor coupled between the second control terminal and the second resonator terminal.

8. The oscillator circuit of claim 1, wherein the BAW resonator and the first and second active inductor circuits are part of an integrated circuit.

9. An oscillator circuit, comprising:
  a bulk acoustic wave (BAW) resonator, the BAW resonator having a resonant frequency at or above 1 gigaHertz (GHz);
  a differential active inductor circuit configured to bias the BAW resonator, and coupled between the BAW resonator and a power supply terminal, the differential active inductor circuit having an impedance that reduces with a frequency at or above 1 GHz; and
  a gain circuit coupled to the BAW resonator.

10. The oscillator circuit of claim 9, wherein:
  the BAW resonator includes a first resonator terminal and a second resonator terminal;
  the oscillator circuit includes a ground terminal; and
  the gain circuit includes:
    a first transistor having:
      a first current terminal coupled to the first resonator terminal;
      a first control terminal coupled to the second resonator terminal; and
      a second current terminal coupled to the ground terminal; and
    a second transistor having:
      a third current terminal coupled to the second resonator terminal;
      a second control terminal coupled to the first resonator terminal; and
      a fourth current terminal coupled to the ground terminal.

11. The oscillator circuit of claim 10, wherein the gain circuit includes a high pass filter, and the high pass filter includes:
  a first capacitor coupled between the first control terminal and the third current terminal; and
  a first resistor coupled between the first control terminal and the first current terminal.

12. The oscillator circuit of claim 11, wherein the high pass filter includes:
  a second capacitor coupled between the second control terminal and the first current terminal; and
  a second resistor coupled between the second control terminal and the third current terminal.

13. The oscillator circuit of claim 9, wherein the BAW resonator includes a first resonator terminal and a second resonator terminal, and the differential active inductor circuit includes:
  a first active inductor circuit coupled between the first resonator terminal and the power supply terminal; and
  a second active inductor circuit coupled between the second resonator terminal and the power supply terminal.

14. The oscillator circuit of claim 13, wherein the first active inductor circuit includes:
  a first transistor having:
    a first current terminal coupled to the power supply terminal;
    a second current terminal coupled to the first resonator terminal; and
    a first control terminal; and
  a first resistor coupled between the second current terminal and the first control terminal.

15. The oscillator circuit of claim 14, wherein the second active inductor circuit includes:
  a second transistor including:
    a third current terminal coupled to the power supply terminal;
    a fourth current terminal coupled to the second resonator terminal; and
    a second control terminal; and
  a second resistor coupled between the fourth current terminal and the second control terminal.

16. The oscillator circuit of claim 15, wherein the differential active inductor circuit includes:
  a first capacitor coupled between the first control terminal and the fourth current terminal; and
  a second capacitor coupled between the second control terminal and the second current terminal.

17. The oscillator circuit of claim 9, wherein the BAW resonator, the differential active inductor circuit, and the gain circuit are part of an integrated circuit.

18. A radar system, comprising:
  a transmitter; and
  an oscillator circuit coupled to the transmitter, and including:
    a bulk acoustic wave (BAW) resonator including a first resonator terminal and a second resonator terminal, the BAW resonator having a resonant frequency at or above 1 gigaHertz (GHz);
    a differential active inductor circuit configured to bias the BAW resonator, and coupled between the BAW resonator and a power supply terminal, the differential active inductor circuit including:
      a first transistor including:
        a first current terminal coupled to the power supply terminal;

a second current terminal coupled to the first resonator terminal; and
a first control terminal;
a first resistor coupled between the second current terminal and the first control terminal;
a second transistor having:
a third current terminal coupled to the power supply terminal;
a fourth current terminal coupled to the second resonator terminal; and
a second control terminal; and
a second resistor coupled between the fourth current terminal and the second control terminal; and
a gain circuit coupled to the BAW resonator.

19. The radar system of claim 18, wherein the differential active inductor circuit includes:
a first capacitor coupled between the first control terminal and the fourth current terminal; and
a second capacitor coupled between the second control terminal and the second current terminal.

20. The radar system of claim 18, wherein:
the oscillator circuit includes a ground terminal; and
the gain circuit includes:
a third transistor having:
a fifth current terminal coupled to the first resonator terminal;
a third control terminal coupled to the second resonator terminal; and
a sixth current terminal coupled to the ground terminal; and
a fourth transistor including:
a seventh current terminal coupled to the second resonator terminal;
a fourth control terminal coupled to the first resonator terminal; and
an eighth current terminal coupled to the ground terminal.

21. The radar system of claim 20, wherein the gain circuit includes a high pass filter, and the high pass filter includes:
a first capacitor coupled between the third control terminal and the seventh current terminal; and
a third resistor coupled between the third control terminal and the fifth current terminal.

22. The radar system of claim 21, wherein the high pass filter includes:
a second capacitor coupled between the fourth control terminal and the fifth current terminal; and
a fourth resistor coupled between the fourth control terminal and the fourth transistor and the third current terminal.

23. The radar system of claim 18, wherein the BAW resonator, the differential active inductor circuit, and the gain circuit are part of an integrated circuit.

* * * * *